United States Patent
Watkins

(10) Patent No.: US 10,027,293 B2
(45) Date of Patent: Jul. 17, 2018

(54) AMPLIFIER FOR MODULATING THE AMPLITUDE OF AN RF SIGNAL

(71) Applicant: Kabushiki Kaisha Toshiba, Minato-ku (JP)

(72) Inventor: Gavin Watkins, Bristol (GB)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/038,957

(22) PCT Filed: Dec. 5, 2013

(86) PCT No.: PCT/GB2013/053220
§ 371 (c)(1),
(2) Date: May 24, 2016

(87) PCT Pub. No.: WO2015/082866
PCT Pub. Date: Jun. 11, 2015

(65) Prior Publication Data
US 2017/0040960 A1    Feb. 9, 2017

(51) Int. Cl.
*H03F 3/217* (2006.01)
*H03F 1/34* (2006.01)
(Continued)

(52) U.S. Cl.
CPC ........... *H03F 3/2175* (2013.01); *H03F 1/342* (2013.01); *H03F 3/193* (2013.01); *H03F 3/2178* (2013.01);
(Continued)

(58) Field of Classification Search
CPC ....................................................... H03F 3/2175
(Continued)

(56) References Cited

U.S. PATENT DOCUMENTS

| 4,399,558 A | 8/1983 | Smollin |
| 4,580,111 A * | 4/1986 | Swanson ............... H03F 3/2175 332/152 |

(Continued)

FOREIGN PATENT DOCUMENTS

CA    1 196 396    11/1985

OTHER PUBLICATIONS

International Search Report and Written Opinion dated Jun. 23, 2014 in PCT/GB13/053220 Filed Dec. 5, 2013.

*Primary Examiner* — Joseph Chang
(74) *Attorney, Agent, or Firm* — Oblon, McClelland, Maier & Neustadt, L.L.P.

(57) ABSTRACT

An amplifier for modulating the amplitude of an RF signal, the amplifier including: a plurality of amplifier circuits, each circuit being connected to a first power source, each circuit including a charge storage device and an output across which a potential difference supplied by the first power source can be applied; a switching arrangement for switching connections between the first power source, the charge storage device, and the output in each amplifier circuit, wherein each circuit includes a first switched configuration in which the charge storage device is charged by the first power source and a second switched configuration in which the charge storage device, once charged, will apply an additional potential difference across the output. The amplifier is configured to vary the amplitude of the RF signal in proportion to the sum of the potential differences applied across the output in each amplifier circuit.

23 Claims, 19 Drawing Sheets

(51) Int. Cl.
*H03F 3/193* (2006.01)
*H03F 3/24* (2006.01)
*H04B 1/04* (2006.01)

(52) U.S. Cl.
CPC ......... *H03F 3/24* (2013.01); *H03F 2200/336* (2013.01); *H03F 2200/339* (2013.01); *H03F 2200/451* (2013.01); *H03F 2200/471* (2013.01); *H03F 2200/541* (2013.01); *H03F 2203/211* (2013.01); *H04B 2001/0408* (2013.01)

(58) Field of Classification Search
USPC ....................................................... 332/178
See application file for complete search history.

(56) References Cited

U.S. PATENT DOCUMENTS

| | | | |
|---|---|---|---|
| 5,345,198 A * | 9/1994 | Jacobson | H03C 1/06 330/251 |
| 5,612,647 A | 3/1997 | Malec | |
| 6,236,284 B1 | 5/2001 | Duello et al. | |
| 2013/0221752 A1 | 8/2013 | Watkins | |

\* cited by examiner

| V_Output | Switching mechanism |
|---|---|
| 3V | Connect the node shared by capacitor C3, diode D5, transistors Q7 and Q8 to ground via transistor Q8, thereby boosting the potential at the node shared by capacitor C3, diode D6 and transistor Q9 to –2V (as capacitor C3 stores -2V)<br><br>Connect this potential to the lower terminal of the transformer through Q9 |
| 2V | Connect the lower terminal of the transformer to -V through transistor Q9 and diode D6 |
| V | Connect the lower terminal of the transformer to ground through transistor Q8 and diode D6 |
| 0 | Connect the upper and the lower terminal of the transformer to +V through transistor Q4 and diode D3 and transistor Q7 and diode D5, respectively |
| -V | Connect ground potential to the upper terminal of the transformer through transistor Q5 and diode D3 |
| -2V | Connect potential –V to the upper terminal of the transformer through transistor Q6 and diode D4 |
| -3V | Connect the node shared by capacitor C2, diode D3 and transistors Q4 and Q5 to ground through transistor Q5, thereby boosting the potential at the node shared by capacitor C2, diode D4 and transistor Q6 to –2V (as capacitor C2 stores -2V);<br><br>Connect this potential to the upper terminal of the transformer through transistor Q6<br><br>Diodes D3 and D4 are non-conductive in this switching state |

Fig. 12

AMPLIFIER FOR MODULATING THE AMPLITUDE OF AN RF SIGNAL

FIELD

Embodiments described herein relate generally to an amplifier.

BACKGROUND

Amplitude modulation (AM) is one of the best known means of encoding a signal with information to be transmitted between parties, with literally millions of AM compatible receivers being available in the public domain. Amplitude modulation has the advantage of providing good signal propagation due to the low frequency bands used. During emergency situations AM has shown itself to be a highly reliable and practical means for distributing information, particularly in the medium wave (MW) 540-1650 kHz.

In order to improve reliability and decrease transmission overheads in amplitude modulation, modern transmitters use digital switching techniques. Such techniques require high power digital to analogue converters that are based on high-speed multilevel power converters, which switch at the RF carrier frequency. To date, such power converters have been designed based on a conventional arrangement of transformer coupled H-bridge class D amplifiers. An example of such an arrangement is provided in FIG. 1, which shows an AM transmitter 101 for MW, using a digital amplitude modulation (DAM) technique. In this example, the input analogue audio signal is first sampled with a 12 bit digitizer 103, with the 7 most significant bits being de-multiplexed and used to drive 127 identical H-bridge class D switching cells 105 (an example of such a switching cell being shown in FIG. 2). The lower 5 bits are in turn used to drive 5 binary weighted amplifiers 107, which serve to increase the resolution in the output signal. Each one of the 5 binary weighted amplifiers 107 supplies ½ the power of the one above it; so, for example, the first of the 5 binary weighted amplifiers will provide ½ the power of the 127 identical H-bridge class D switching cells 105, and the last of the 5 binary weighted amplifiers will provide 1/32 of the power of the 127 identical H-bridge class D switching cells 105.

Conventional power converters, such as that shown in FIG. 1 have a core limitation that in order to achieve sufficient signal fidelity, it may be necessary to include as many as 132 H-bridge cells, with each H-bridge cell requiring its own transformer to couple the cell to the output. As a result of using this number of transformers, the weight, size and manufacturing costs of the converters are increased.

BRIEF DESCRIPTION OF FIGURES

Embodiments of the invention will now be described by way of example with reference to the accompanying drawings in which:

FIG. 12 shows a table summarising the different configurations of the circuit shown in FIG. 10.

DETAILED DESCRIPTION

Figure 1:
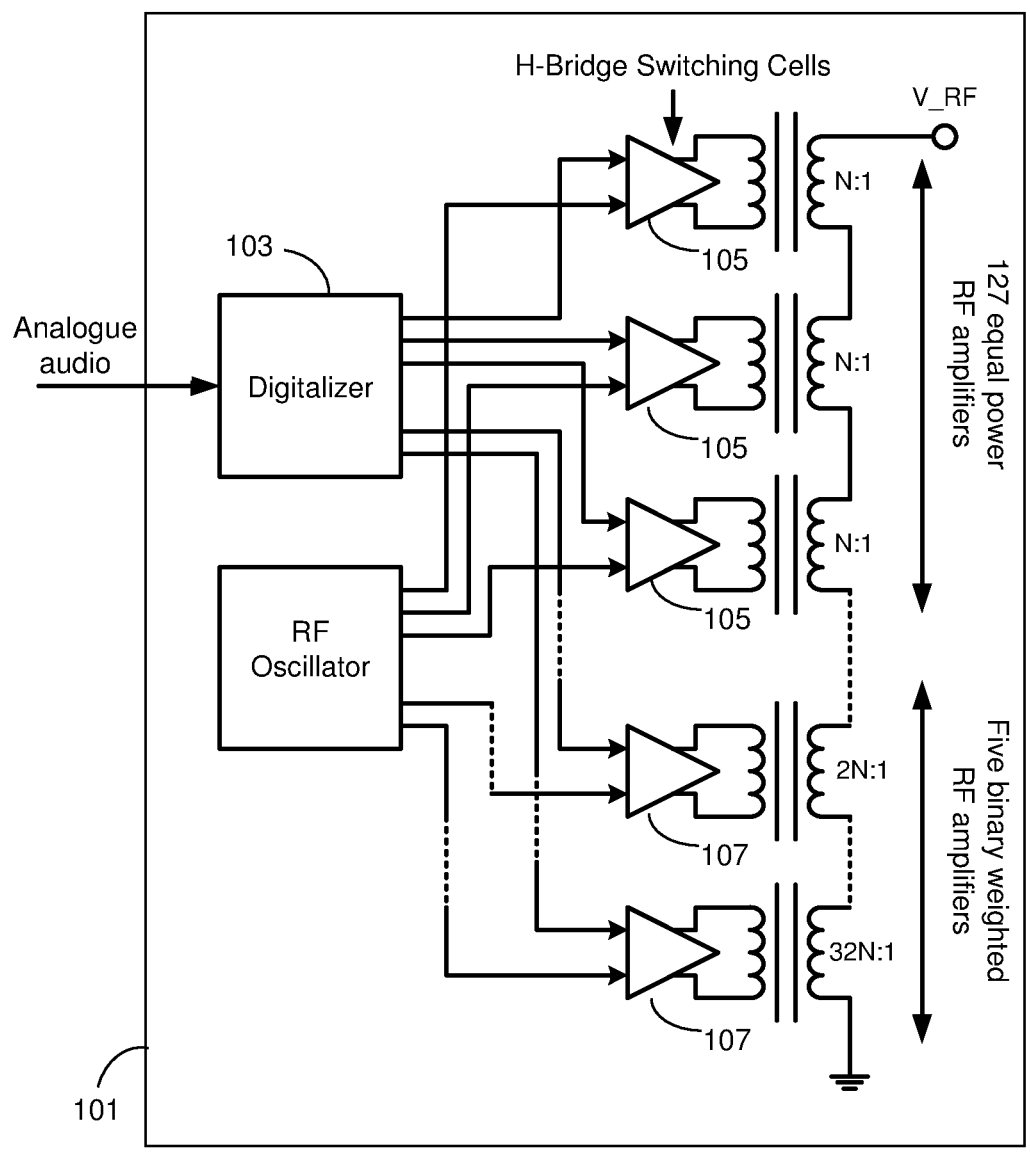
FIG. 1 shows a schematic of a conventional amplifier.
Figure 2:
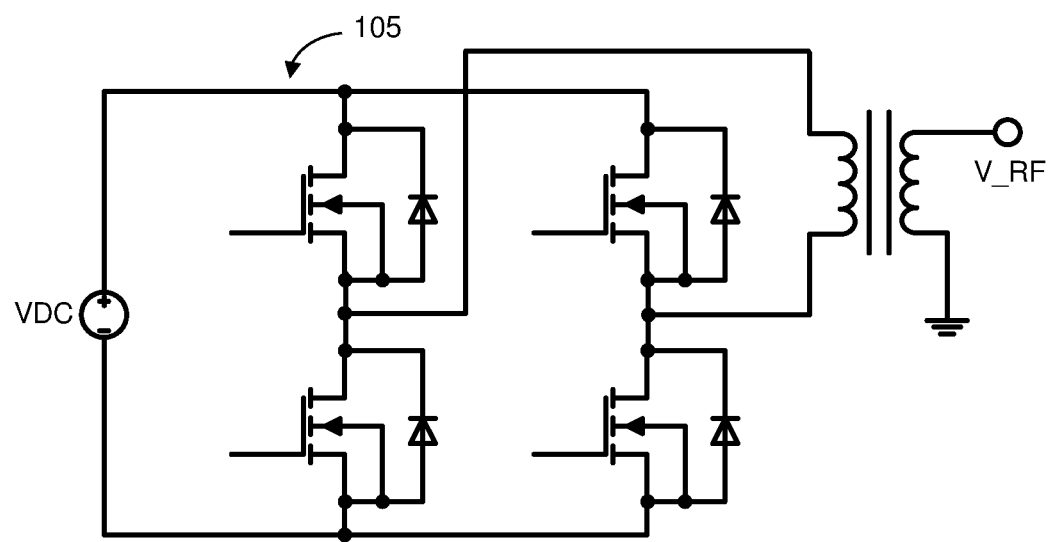
FIG. 2 shows an H-bridge class D switching cell as used in the amplifier of FIG. 1.

According to a first embodiment, there is provided an amplifier for modulating the amplitude of an RF signal, the amplifier comprising:
a plurality of amplifier circuits, each circuit being connected to a first power source, each circuit having a charge storage device and an output across which a potential difference supplied by the first power source can be applied;
a switching arrangement for switching connections between the first power source, the charge storage device and the output in each amplifier circuit, wherein each circuit has a first switched configuration in which the charge storage device is charged by the first power source and a second switched configuration in which the charge storage device, once charged, will apply an additional potential difference across the output;
the amplifier being configured to vary the amplitude of the RF signal in proportion to the sum of the potential differences applied across the output in each amplifier circuit.

In some embodiments, when a respective amplifier circuit is in the first switched configuration, the first power source is arranged to apply a potential difference across the output of that amplifier circuit, in addition to charging the charge storage device.

In some embodiments, when a respective amplifier circuit is in the second switched configuration, the first power source is arranged to apply a potential difference across the output of that amplifier circuit.

In some embodiments, each amplifier circuit is connected to a second power source and the switching arrangement is arranged to switch connections between the second power source, the charge storage device and the output in each amplifier circuit, wherein when a respective amplifier circuit is in the first switched configuration, the charge storage device in that amplifier circuit is charged by both the first power source and the second power source.

In some embodiments, when a respective amplifier circuit is in the first switched configuration, both the first power source and second power source are arranged to apply a potential difference across the output of that amplifier circuit, in addition to charging the charge storage device.

In some embodiments, when a respective amplifier circuit is in the second switched configuration, the first power source is arranged to apply a potential difference across the output of that amplifier circuit and the second power source is excluded from applying a potential difference across the output of that amplifier circuit.

In some embodiments, each amplifier circuit has a primary transformer winding connected across its respective output, the primary transformer windings being arranged to induce a voltage in a secondary transformer winding, wherein the voltage induced in the secondary transformer winding is used to determine the amplitude of the RF signal.

In some embodiments, each amplifier circuit comprises a first sub-circuit and a second sub-circuit, the charge storage device and the output being comprised within the first sub-circuit and the second sub-circuit comprising a second charge storage unit and a second output across which a potential difference supplied by the first power source can be applied. The switching arrangement may be configured to switch connections between the first power source, the charge storage device and the output in the first sub-circuit and to switch connections between the first power source, the second charge storage device and the second output in the second sub-circuit. Each sub-circuit may have a first switched configuration in which its charge storage device is charged by the first power source and a second switched configuration in which its charge storage device, once charged, will apply an additional potential difference across the output of the sub-circuit. The amplifier may be configured to vary the amplitude of the RF signal in proportion to the sum of the potential differences applied across each one of the outputs in the sub-circuits.

In some embodiments, when a respective sub-circuit is in the first switched configuration, the first power source is arranged to apply a potential difference across the output of that sub-circuit, in addition to charging the charge storage device in that sub-circuit.

In some embodiments, when a respective sub-circuit is in the second switched configuration, the first power source is arranged to apply a potential difference across the output of that sub-circuit.

In some embodiments, each sub-circuit is connected to a second power source and the switching arrangement is arranged to switch connections between the second power source, the charge storage device and the output in each sub-circuit, wherein when a respective sub-circuit is in the first switched configuration, the charge storage device in that sub-circuit is charged by both the first power source and the second power source.

In some embodiments, when a respective sub-circuit is in the first switched configuration, both the first power source and second power source are arranged to apply a potential difference across the output of that sub-circuit, in addition to charging the charge storage device in that sub-circuit.

In some embodiments, when a respective sub-circuit is in the second switched configuration, the first power source is arranged to apply a potential difference across the output of that sub-circuit and the second power source is excluded from applying a potential difference across the output of that sub-circuit.

In some embodiments, within each amplifier circuit, the first and second sub-circuits are arranged such that when the first sub-circuit is in its first and second switched configurations, the potential difference that is applied across the output of the first sub-circuit is in the opposite direction from the potential difference that is applied across the second sub-circuit when the second sub-circuit is in its first and second switched configurations.

In some embodiments, for each amplifier circuit, the switching arrangement is configured to alternate activation of the first and second sub-circuits, such that when a potential difference is applied across the output of one of the two sub-circuits, no potential difference is applied across the output of the other of the two sub-circuits.

In some embodiments, the amplifier is configured to activate the first sub-circuits in unison and to activate the second sub-circuits in unison. When the first sub-circuits are activated, each one of the first sub-circuits may contribute to increasing the positive amplitude of the RF signal. When the second sub-circuits are activated, each one of the second sub-circuits may contribute to increasing the negative amplitude of the RF signal.

In some embodiments, the amplifier is configured to alternate activation of the first and second sub-circuits at a frequency that is twice that of the carrier frequency of the RF signal.

In some embodiments, each sub-circuit has a primary transformer winding connected across its respective output, the primary transformer windings being arranged to induce a voltage in a secondary transformer winding, wherein the voltage induced in the secondary transformer winding is used to determine the amplitude of the RF signal.

In some embodiments, in each amplifier circuit, the coils that are connected across the output of the first and second sub-circuits share a common node with one another.

In some embodiments, the amplifier comprises an I/Q Up-Converter, wherein the Up-Converter is configured to encode phase information on the RF signal by driving the switching arrangement to activate the first and second sub-circuits at pre-determined intervals.

In some embodiments, the amplifier comprises a detector for monitoring the amplified signal and for providing associated feedback to the amplifier, such that the amplifier is able to moderate the amplitude of the RF signal.

In some embodiments, the amplifier comprises an analogue to digital converter for converting an input analogue RF signal to a digital signal before varying the amplitude of the digitised signal.

According to a second embodiment, there is provided a transmitter comprising an amplifier according to the first embodiment and an antenna for broadcasting the amplified signal.

Embodiments discussed herein can provide a low cost, low weight power converter. As one example, by adopting a multilevel architecture as discussed herein, it is possible to provide a power converter in which the number of transformers can be reduced to 45, as compared to 132 in the conventional amplifier of FIG. 1. Embodiments can provide a digital transmitter architecture that is suitable for amplitude modulation (AM) radio transmission in the MW (540-1610 kHz), in addition to other compatible bands.

Figure 3:
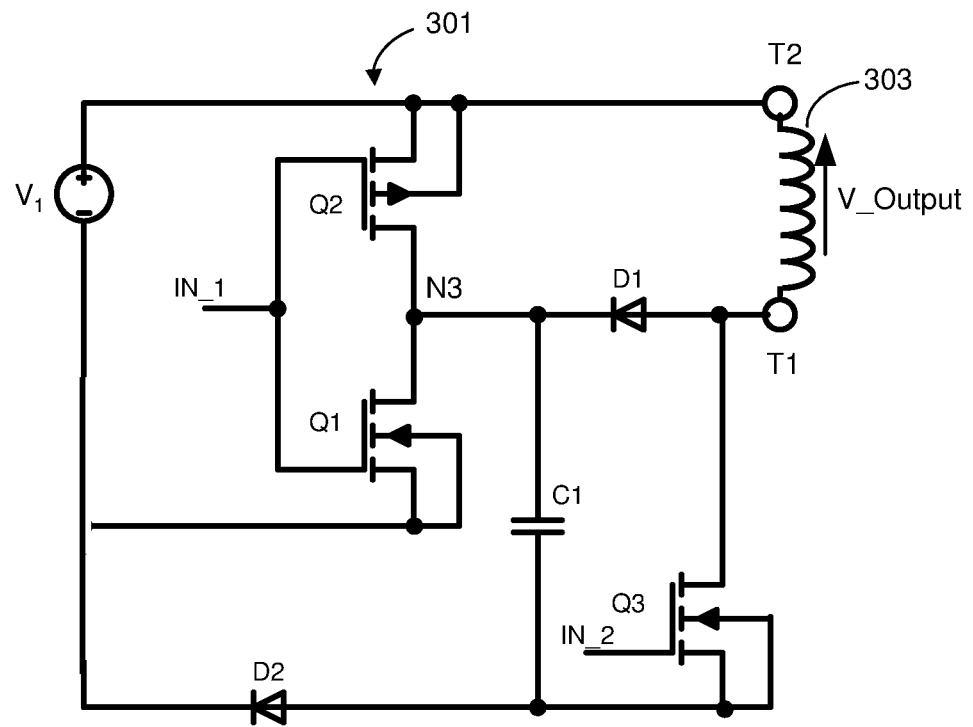
FIG. 3 shows a sub-circuit for use in an amplifier according to a first embodiment.

FIG. 3 shows an example of an amplifier sub-circuit 301 for implementing in an amplifier according to an embodiment. The sub-circuit includes a power source $V_1$, and two output terminals T1 and T2 that together define an output for the sub-circuit. A coil 303, which forms the primary coil of a transformer (not shown), is connected between the two terminals T1 and T2. The sub-circuit 301 also includes a charge storage device in the form of a capacitor C1 and a switching arrangement that comprises a number of switches, which in the present embodiment take the form of transistors Q1, Q2 and Q3.

The switches Q1 and Q2 are both controlled by an input signal IN_1. When the input signal IN_1 is low, the transistor Q2 will conduct and transistor Q1 will not conduct. When the input signal IN_1 is high, the transistor Q1 will conduct and transistor Q2 will not conduct.

It will be appreciated that, whilst transistors Q1 and Q2 have different polarities and can consequently be switched using a single input signal (signal IN_1), it is possible to use two separate transistors having the same (or different) polarity, where those transistors are switched with their own respective input signals (the respective input signals being out of phase for the case where the transistors have the same polarity, or in phase for the case where the transistors have opposing polarities). In the present example, transistor Q1 is a n-channel MOSFET that conducts when the input signal IN_1 is high and does not conduct when input signal IN_1 is low. Transistor Q2 is a p-channel MOSFET that exhibits a switching behaviour opposite to that of transistor Q1.

The switch Q3 is controlled by another input signal IN_2. When the input signal IN_2 is low, transistor Q3 will not conduct. When the input signal IN_2 is high, transistor Q3 will conduct.

By operating the switches Q1, Q2 and Q3 in particular combinations, it is possible to alter the flow of current through the circuit, thereby causing the capacitor to alternately charge and discharge and making it possible to vary the potential difference V_Output that is applied across the transformer coil.

Figure 4:
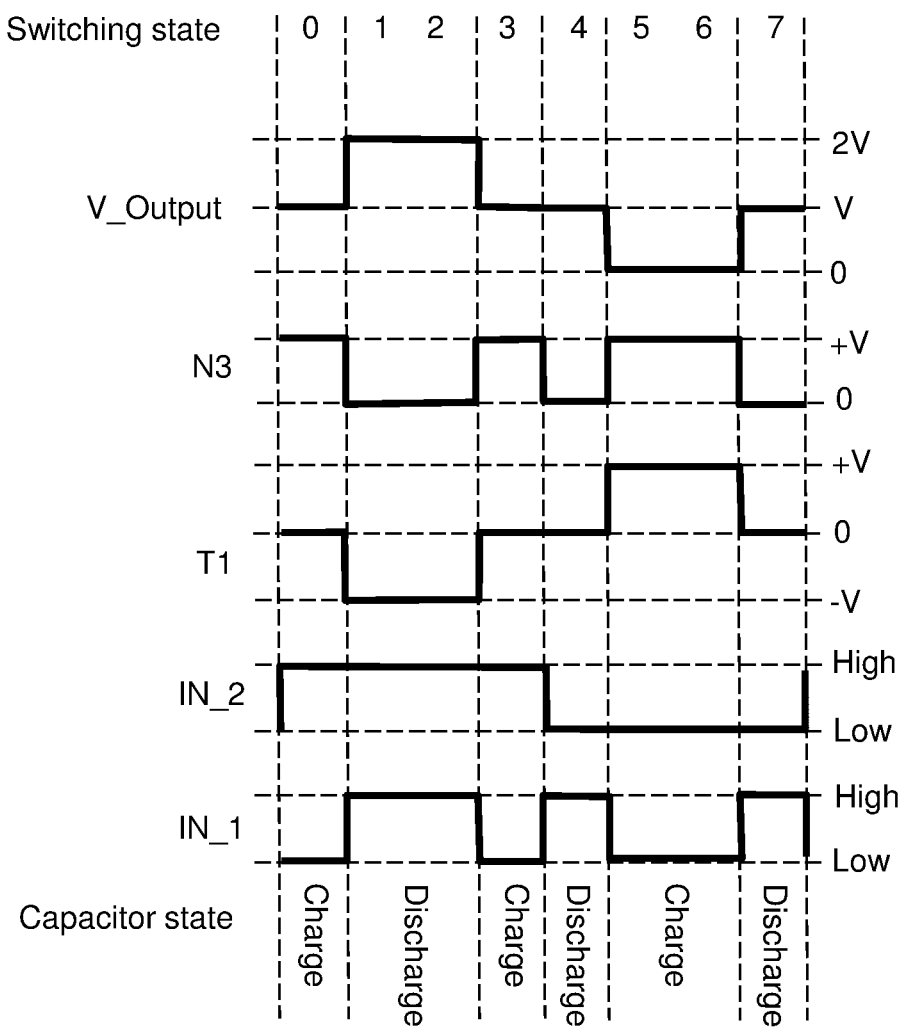
FIG. 4 is a graph showing how the voltage at different points in the sub-circuit of FIG. 3 varies for different configurations of the switches Q1, Q2 and Q3.

The precise way in which the potential difference V_Output is varied can be explained with reference to FIG. 4, which shows the voltage at different points in the circuit for different configurations of the switches Q1, Q2 and Q3. It will be understood that the particular sequence of switching states 0 to 7 shown in FIG. 4 is provided for illustration only; it is not essential to cycle through this particular sequence of states when operating the circuit 301. For the purpose of explanation, the potential at the positive terminal of the power source $V_1$ will be taken to be +V, and the potential at the negative terminal of the power source $V_1$ will be taken to be 0. It will be evident that in all switching states, the potential at the terminal T2 will be equal to that at the positive terminal of the power source i.e. +V.

Referring to FIG. 4, in the first switching state (switching state 0), the input signal IN_1 is low and input signal IN_2 is high. In this configuration, transistors Q2 and Q3 both conduct, whilst transistor Q1 does not conduct. Consequently, the capacitor C1 and the primary transformer coil are connected in parallel with one another across the power source $V_1$. The capacitor C1 will charge until the voltage across its plates equals that of the power source, but in the opposite direction. The potential difference across the output V_Output will be equal to the voltage V supplied by the power source. (The voltage drop across the diode D2 is assumed to be negligible here).

In the next switching state (switching state 1), the input signal IN_1 is switched from low to high, with the result that the transistor Q1 will begin to conduct, whilst transistor Q2 ceases to conduct. Consequently, the positive terminal of the capacitor C1 will be connected to the negative terminal of the power source via the node N3 and transistor Q1. Both the node N3 and the positive terminal of the capacitor will, therefore, now be at the same potential as the negative terminal of the power source (i.e. 0). Since the capacitor C1 was charged in the previous switching state to a voltage of V, the negative terminal of the capacitor will now be at a potential of −V. The negative terminal of the capacitor will be connected via the transistor Q3 to the output terminal T1, which will also now be at a potential of −V. As a result, the total potential difference V_output across the output terminals T1 and T2 will be equal to +V−(−V)=2V. The diode D2 will meanwhile interrupt current flow between the negative terminal of the power source and the transistor Q3.

In the present example, the switching state 2 is the same as state 1. The next change in the circuit configuration occurs in period 3, when the Input IN_1 returns from high to low. The circuit reverts to the same configuration as in switching state 0; the capacitor C1 is connected in parallel with the transformer coil 303 and is charged to a potential V, whilst the power source $V_1$ applies a potential difference of +V across the transformer coil.

In switching state 4, the input signal IN_1 is switched from low to high again, whilst the input signal IN_2 switches from high to low. In this switching state, transistor Q1 conducts, whilst neither transistor Q2 nor Q3 conduct. Thus, the terminal T1 will be connected to the negative terminal of the power source via the diode D1, the node N3 and transistor Q1, meaning that the potential at the terminal T1 remains at 0. The potential difference applied across the output terminals V_output will likewise stay at +V.

In switching state 5, the input signal IN_1 is switched from high to low, such that transistor Q2 begins to conduct and transistor Q1 ceases to conduct. Since the Input signal IN_2 remains at low, transistor Q3 will not conduct. Here, the capacitor C1 will again be charged to a voltage equal to that supplied by the power source. At the same time, the potential at the terminal T1 will increase to +V, the same as that at the node N3 and the positive terminal of the capacitor. Since both output terminals T1 and 12 are at the same potential, there is no potential difference applied across the transformer coil and V_Output falls to 0. The same state is maintained in switching state 6.

In switching state 7, the same switching configuration is adopted as that of switching state 4, with the potential difference applied across the output returning to +V.

Thus, by operating the switches in different combinations, it is possible to produce 3 distinct voltages across the transformer coil (0, +V and +2V), all by using a single power source. By varying the voltage that is applied across the transformer coil, the current passing through the coil can also be made to vary, which will in turn produce a changing magnetic field that can be used to induce a voltage in a secondary transformer coil.

Figure 5:
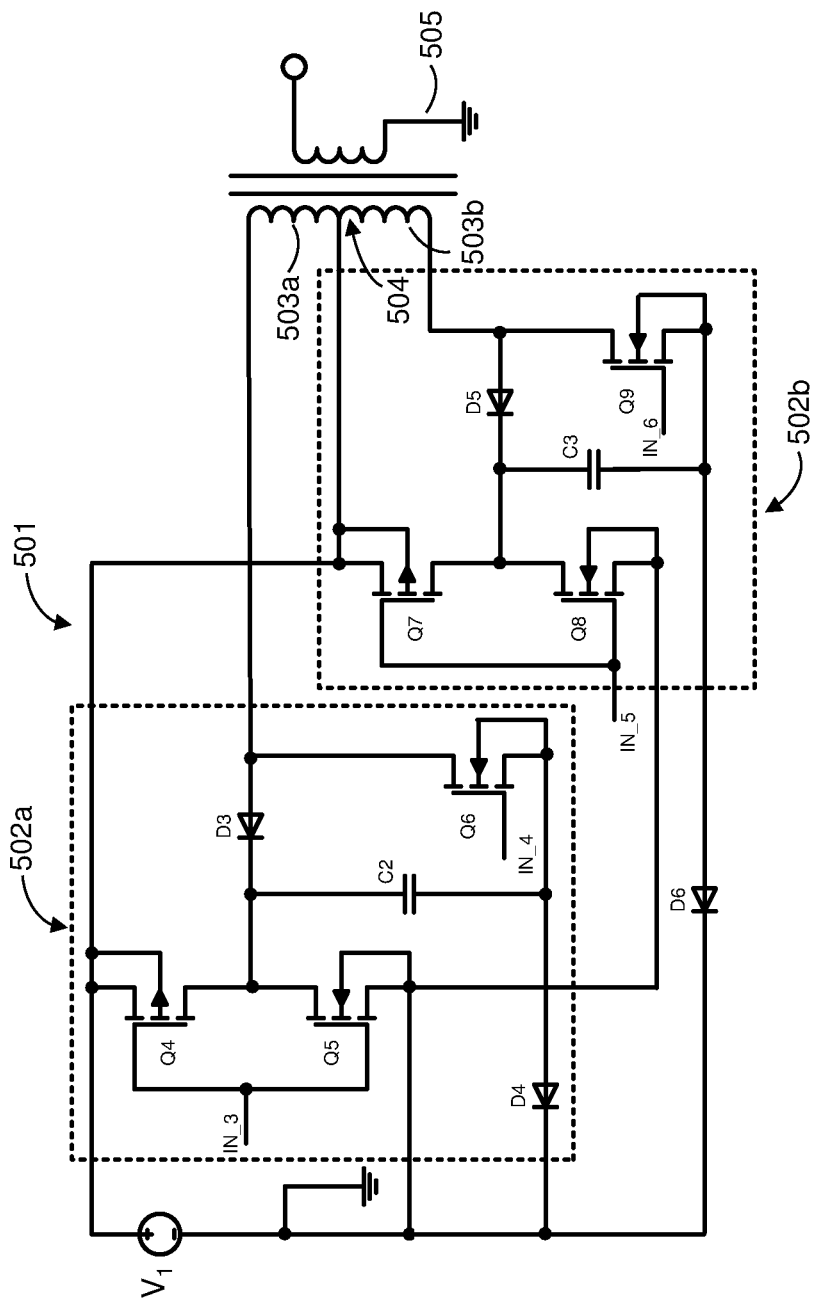
FIG. 5 shows an amplifier circuit for use in an amplifier according to the first embodiment.

FIG. 5 shows an example of an amplifier circuit 501 for implementing in an amplifier according to an embodiment. In this embodiment, the amplifier circuit 501 includes a first sub-circuit 502a and a second sub-circuit 502b that can be used to vary the direction of the voltage induced in the secondary transformer coil 505. As can be seen, the first sub-circuit 502a and the second sub-circuit 502b each resemble the circuit 301 shown in FIG. 3, the two sub-circuits each having a charge storage device and the same arrangement of switches and diodes as that shown in FIG. 3.

In the present embodiment, the output of the amplifier circuit 501 comprises two primary windings 503a, 503b of a transformer, where the windings 503a, 503b are connected as part of the first sub-circuit 502a and second sub-circuit 502b, respectively. The two primary windings share a common terminal 504 that is permanently connected to the positive terminal of the power source $V_1$.

In the same way as in the circuit of FIG. 3, the potential difference that is applied across the respective windings 503a, 503b (and in turn the current that passes through them) can be controlled by adjusting the configuration of the switches in the two sub-circuits 502a, 502b. It will be appreciated that, where the switches in the two sub-circuits are adjusted to have the same state, the potential difference that is applied across the respective primary windings will be equal in magnitude, but opposite in direction. The difference in direction follows from the geometry of the windings and in particular, the fact that the common terminal 504 that is connected to the positive terminal of the power source serves as the lower terminal of the winding 503a in the first sub-circuit and the upper terminal of the winding 503b in the second sub-circuit. Thus, respective positive and negative voltages can be induced in the secondary side 505 of the transformer by applying a negative potential at the upper terminal of the winding 503a in the first sub-circuit (i.e. the terminal that shares a node with diode D3 and transistor Q6) and by applying a positive potential at the lower terminal of the winding 503b in the second sub-circuit (i.e. the terminal that shares a node with diode D5 and transistor Q9). Typically, only one of the two primary windings will be in use at any one time.

In the amplifier circuit 501 of FIG. 5, the two primary windings 503a have an equal number of turns. In some embodiments, each primary winding will provide a 1:1 transformation of an applied voltage to the secondary side. It will be appreciated that 1:1 transformation is, however, not essential and other ratios may be chosen, depending on the desired output voltages. If the amplifier circuit 501 is configured so that 1:1 transformation between the primary and secondary sides is achieved, then the voltage V_Output that is output from the amplifier circuit 501 is the same voltage as the voltage difference applied across whichever one of the two primary windings 503a, 503b is currently in use.

Figure 6:
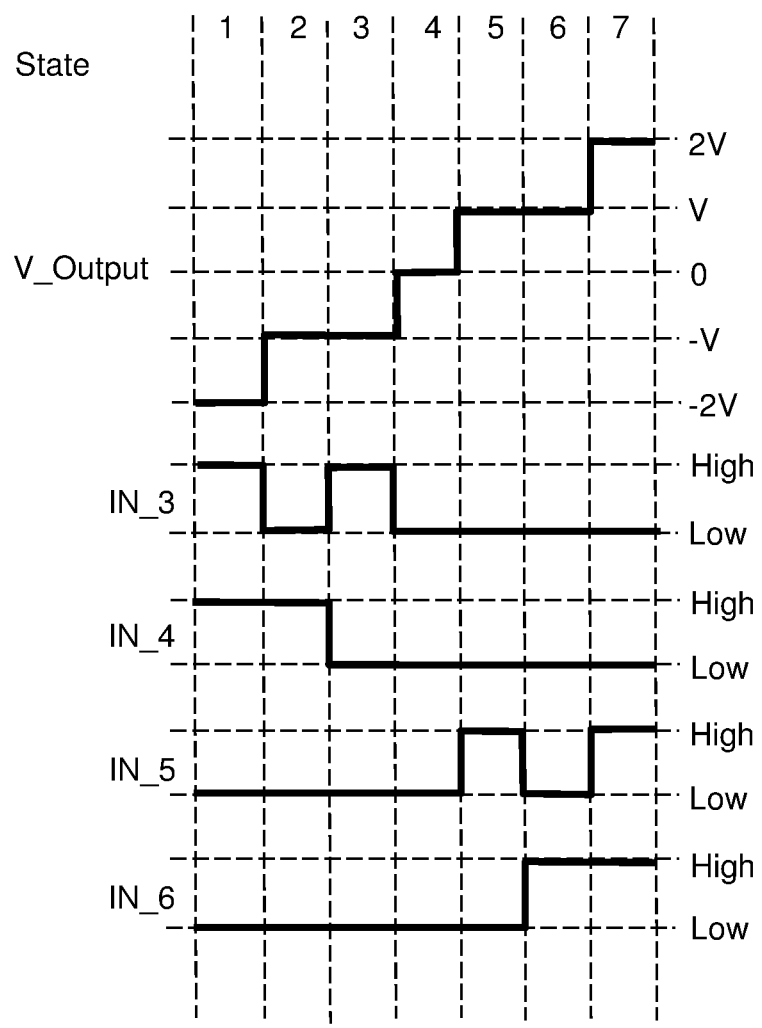
FIG. 6 is a graph showing how the voltage applied across the transformer in the amplifier circuit of FIG. 5 varies for different configurations of the switches in the amplifier circuit.

FIG. 6 shows how the output voltage V_Output that is applied across the primary windings 503a, 503b varies depending on the state of the switches in the two sub-circuits. It will be appreciated that where V_Output is positive, this corresponds to a voltage being applied across the primary winding 503a of the first sub-circuit 502a and where V_Output is negative, this corresponds to a voltage being applied across the primary winding 503b of the second sub-circuit 502b. Thus, the amplifier circuit of FIG. 5 can output a total of 5 different voltages, ranging from −2V to +2V.

Figure 7:
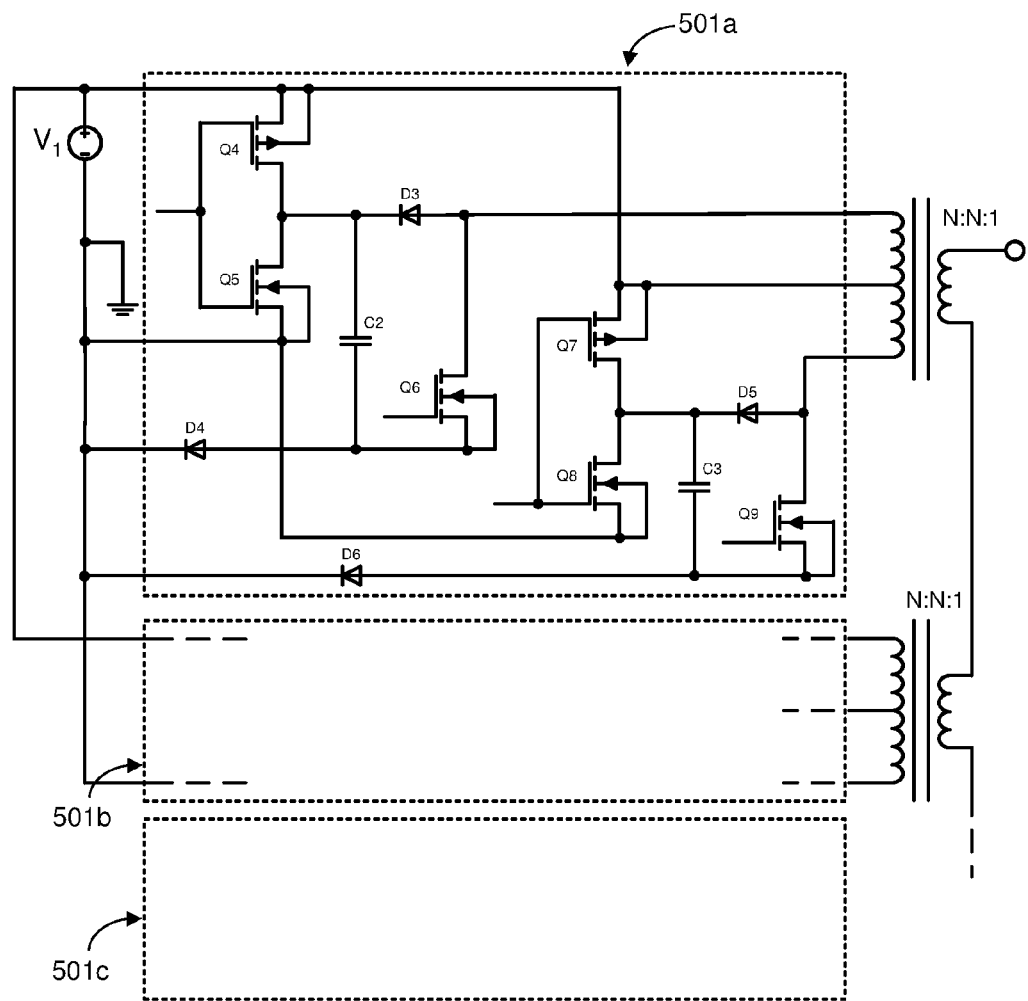
FIG. 7 shows how a plurality of amplifier circuits such as that shown in FIG. 5 may be arranged in a cascade in an amplifier according to the first embodiment.

FIG. 7 shows how an example in which a plurality of amplifier circuits 501a, 501b, 501c, such as the one shown in FIG. 5, are arranged in a cascade and used to generate a large number of different voltages for use in amplifying an input RF signal (for clarity, only the second amplifier circuit 501b is shown as being connected to the power source $V_1$, but it will be appreciated that the third amplifier circuit 501c and any additional amplifier circuits can also be connected to the power source $V_1$ in a similar fashion).

In the example shown in FIG. 7, each one of the amplifier circuits 501a, 501b, 501c, has the same arrangement of switches and diodes and charge storage device as in the amplifier circuit 501 of FIG. 5. The amplifier circuits are each arranged in parallel with one another and are all powered by the same single power source $V_1$. The potential difference that is applied across the primary windings in each amplifier circuit 501a, 501b, 501c can be controlled independently by adjusting the switches in the respective amplifier circuits. The total voltage induced in the secondary transformer coil determines the amplitude of the RF signal. Since each individual amplifier circuit 501a, 501b, 501c, can output a total of 5 different voltages (−2V, −V, 0, +V and +2V), the total number of discrete voltages that can be induced in the secondary coil is increased compared to the example shown in FIG. 5, providing an overall higher dynamic range for amplifying the input RF signal.

Figure 8:
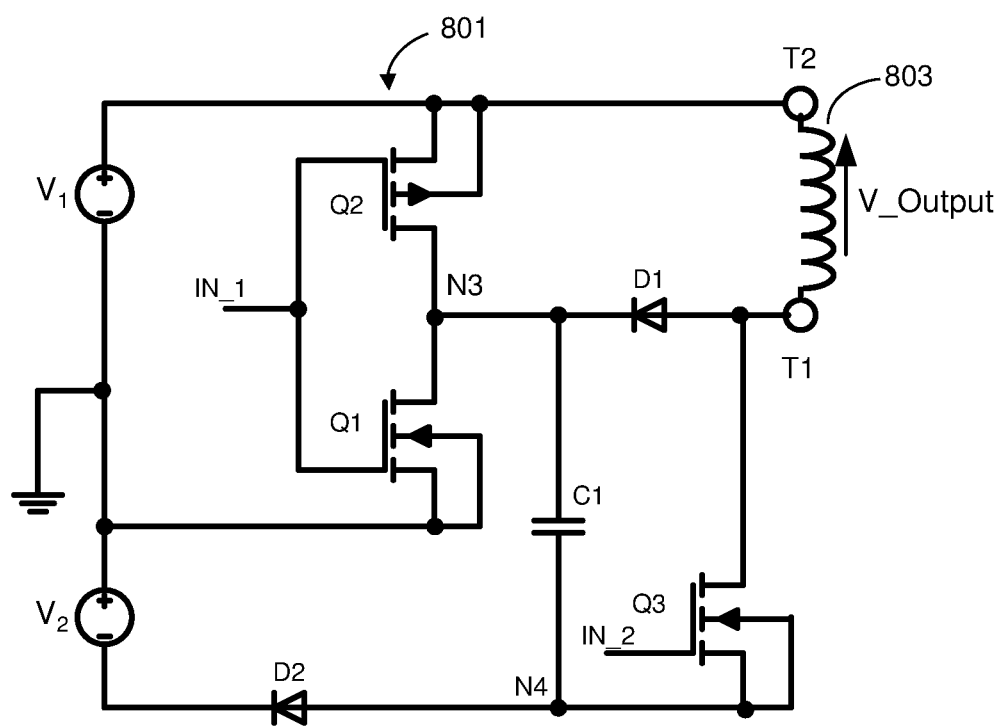
FIG. 8 shows a sub-circuit for use in an amplifier according to a second embodiment.

FIG. 8 shows another example of a sub-circuit 801 for implementing in an amplifier according to an embodiment. The sub-circuit 801 is similar to that shown in FIG. 3, but includes a second power source $V_2$ that is connected in series with the first power source $V_1$, such that the negative terminal of the first power source $V_1$ is at the same potential as the positive terminal of the second power source $V_2$. As in the sub-circuit of FIG. 3, the sub-circuit 801 includes two output terminals T1, T2 that together define an output for the sub-circuit, with a transformer coil 803 being connected between the output terminals. The sub-circuit 801 also includes a charge storage device in the form of a capacitor C1 and a switching arrangement that comprises a number of switches, which in the present embodiment take the form of transistors Q1, Q2 and Q3.

The switches Q1 and Q2 are both controlled by an input IN_1. When the input signal IN_1 is low, the transistor Q2 will conduct and transistor Q1 will not conduct. When the input signal IN_1 is high, the transistor Q1 will conduct and transistor Q2 will not conduct. The switch Q3 is controlled by an input IN_2. When the input signal IN_2 is low, transistor Q3 will not conduct. When the input signal IN_2 is high, transistor Q3 will conduct.

By operating the switches Q1, Q2 and Q3 in particular combinations, it is possible to alter the flow of current through the sub-circuit, thereby causing the capacitor to alternately charge and discharge and making it possible to vary the potential difference V_Output that is applied across the transformer coil 803.

The precise way in which the potential different V_Output is varied in the circuit of FIG. 8 can be explained with reference to FIG. 9, which shows the voltage at different points in the sub-circuit for different configurations of the switches Q1, Q2 and Q3. For the purpose of explanation, the potential at the positive terminal of the first power source $V_1$ will be taken to be +V, the potential at the negative terminal of the first power source $V_1$ (and at the positive terminal of the second power source $V_2$) will be taken to be 0, and the potential at the negative terminal of the second power source $V_2$ will be taken to be −V. Although this implies that the magnitude of the voltage supplied by each power source is the same (+V), this is not essential and in some embodiments, the two power sources may supply voltages of different magnitude from one another.

It will be evident that in all switching states, the potential at the terminal T2 will be equal to that at the positive terminal of the first power source i.e. +V. As in the case of FIG. 4, it will be understood that the particular sequence of switching states 0 to 7 shown in FIG. 9 is provided for illustration only; it is not essential to cycle through this particular sequence of states when operating the sub-circuit 801.

Figure 9:
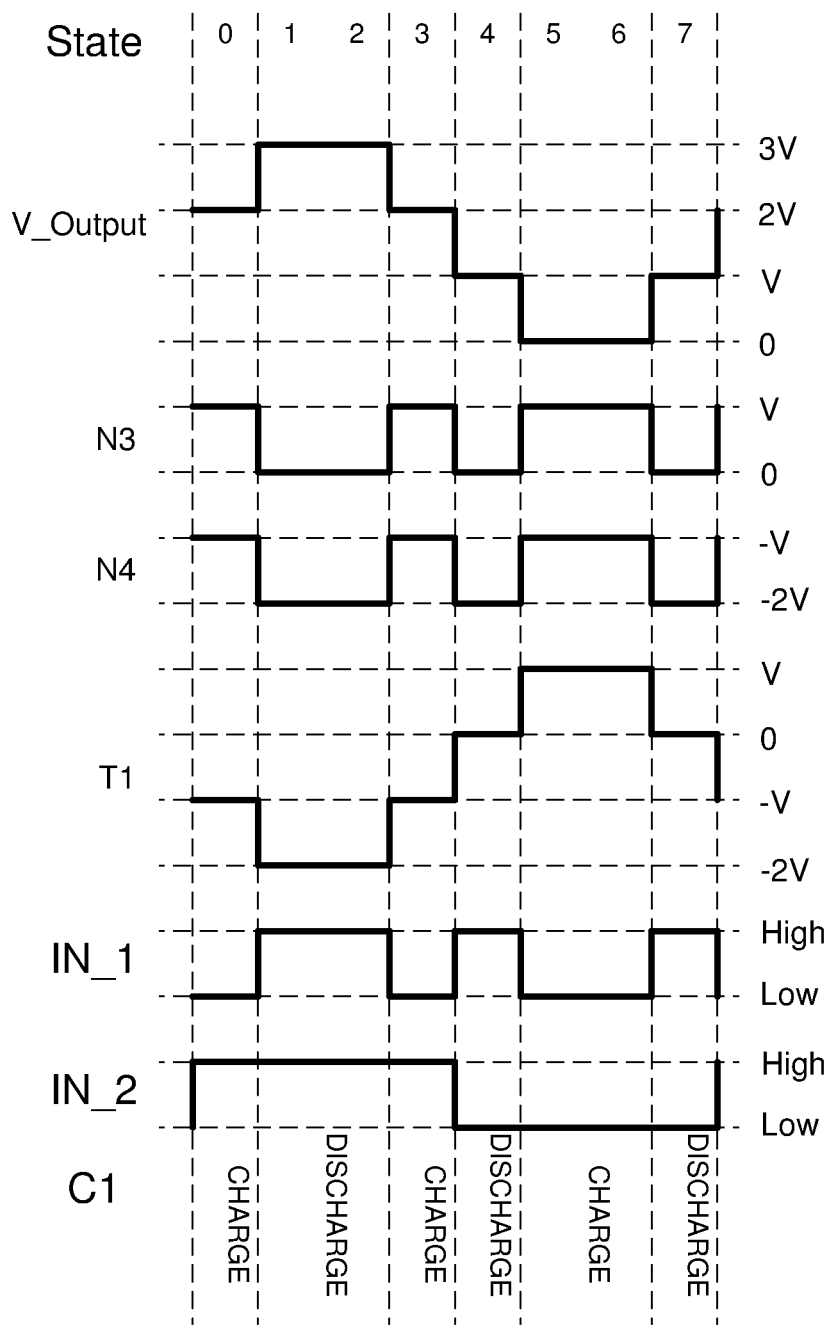
FIG. 9 is a graph showing how the voltage at different points in the sub-circuit of FIG. 8 varies for different configurations of the switches in the sub-circuit.

Referring to FIG. 9, in the first switching state (switching state 0), the input signal IN_1 is low and input signal IN_2 is high. In this configuration, transistors Q2 and Q3 both conduct, whilst transistor Q1 does not conduct. Consequently, the capacitor C1 and the primary transformer coil 903 are connected in parallel with one another across the two power sources $V_1$ and $V_2$. The capacitor C1 will charge until the voltage across its plates equals the sum of the two power sources, but in the opposite direction. The potential difference across the primary transformer coil V_Output will be equal to the sum of the voltages supplied by the two power sources (i.e +2V).

In the next switching state (switching state 1), the input signal IN_1 is switched from low to high, with the result that the transistor Q1 will begin to conduct whilst transistor Q2 ceases to conduct. Here, the positive (upper) terminal of the capacitor will be connected to the negative terminal of the first power source $V_1$ via the node N3 and transistor Q1. Both the node N3 and the positive terminal of the capacitor will, therefore, now be at the same potential as the negative terminal of the first power source $V_1$ (i.e. 0). Since the capacitor C1 was charged in the previous switching state to a voltage of −2V, the negative terminal of the capacitor will now be at a potential of −2V. The negative terminal of the capacitor will be connected via the transistor Q3 to the output terminal T1, which will also now be at a potential of −2V. As a result, the total potential difference V_Output across the output terminals T1 and T2 will be equal to +V−(−2V)=+3V. The diode D2 will meanwhile interrupt current flow between the negative terminal of the second power source $V_2$ and the transistor Q3.

In the present example, the switching state 2 is the same as state 1. The next change in the circuit configuration occurs in period 3, when the Input IN_1 returns from high to low. The circuit reverts to the same configuration as in switching state 0; the capacitor C1 is connected in parallel with the transformer coil and is charged to a potential 2V, whilst the two power sources apply a total potential difference of 2V across the transformer coil.

In switching state 4, the input signal IN_1 is switched from low to high again, whilst the input signal IN_2 switches from high to low. In this switching state, transistor Q1 conducts, whilst neither transistor Q2 nor Q3 conduct. Thus, the terminal T1 will be connected to the negative terminal of the first power source $V_1$ via the diode D1, the node N3 and transistor Q1, meaning that the potential at the terminal T1 remains at 0. The potential difference applied across the output terminals V_Output will likewise stay at V.

In switching state 5, the input signal IN_1 is switched from high to low, such that transistor Q2 begins to conduct and transistor Q1 ceases to conduct. Since the Input signal IN_2 remains at low, transistor Q3 will not conduct. Here, the capacitor C1 will again charge to a voltage equal to the sum of that supplied by the two power sources. At the same time, the potential at the terminal T1 will increase to +V, the same as that at the node N3 and the positive (upper) terminal of the capacitor. Since both output terminals T1 and T2 are at the same potential, there is no potential difference applied across the transformer coil and V_Output falls to 0. The same state is maintained in switching state 6.

In switching state 7, the same switching configuration is adopted as that of switching state 4, with the potential difference applied across the output returning to +V.

By operating the switches in different combinations, therefore, it is possible to produce 4 distinct voltages across the transformer coil (0, +V, +2V and +3V). By varying the voltage that is applied across the transformer coil 903, the current passing through the coil can also be made to vary, which will in turn produce a changing magnetic field that can be used to induce a voltage in a secondary transformer coil.

Figure 10:
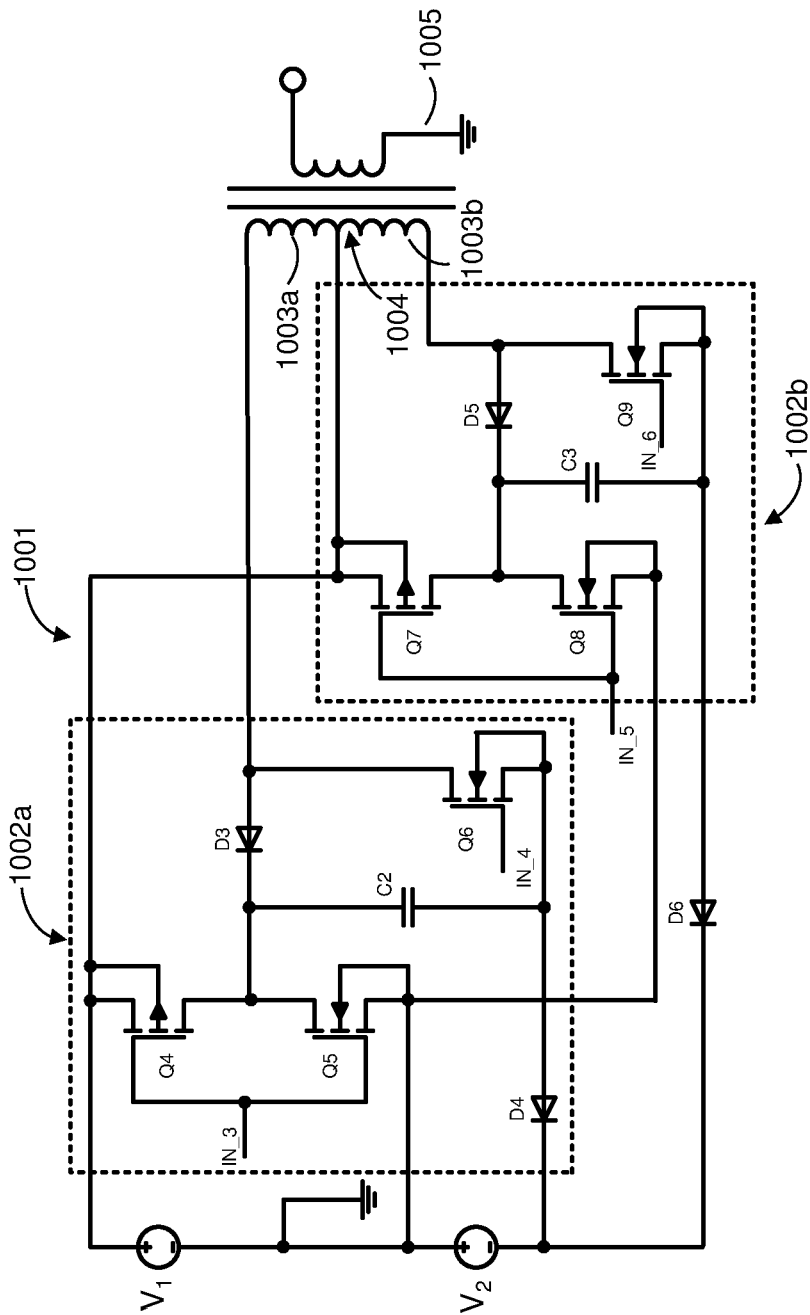
FIG. 10 shows an amplifier circuit for use in an amplifier according to the second embodiment.

FIG. 10 shows another example of an amplifier circuit 1001 for implementing in an amplifier according to an embodiment. The amplifier circuit 1001 combines features of the circuits shown in FIGS. 5 and 8; as in the circuit of FIG. 5, the amplifier circuit 1001 includes a first sub-circuit 1002a and a second sub-circuit 1002b that can be used to vary the direction of the voltage induced in the secondary transformer coil 1005. The sub-circuits 1002a, 1002b themselves resemble the circuit 801 shown in FIG. 8, the two sub-circuits 1002a, 1002b each having a charge storage device Q2, Q3 and the same arrangement of switches and diodes as that shown in FIG. 8.

As in the embodiment shown in FIG. 5, the output of the amplifier circuit of FIG. 10 comprises two primary windings 1003a, 1003b of a transformer, where the windings are connected as part of the first sub-circuit 1002a and second sub-circuit 1002b, respectively. The two primary windings 1003a, 1003b share a common terminal 1004 that is permanently connected to the positive terminal of the power source $V_1$. The potential difference that is applied across the respective windings 1003a, 1003b (and in turn the current that passes through them) can be controlled by adjusting the configuration of the switches in the two sub-circuits 1002a, 1002b. As before, where the switches in the two sub-circuits are adjusted to have the same state, the potential difference that is applied across the respective primary windings 1003a, 1003b will be equal in magnitude, but opposite in direction, as a result of the geometry of the windings. Thus, respective positive and negative voltages can be induced in the secondary side 1005 of the transformer by applying a negative potential at the upper terminal of the primary winding 1003a in the first sub-circuit (i.e. the terminal sharing a node with diode D3 and transistor Q6) or a positive potential at the lower terminal of the primary winding 1003b in the second sub-circuit (i.e. the terminal sharing a node with diode D5 and transistor Q9). Typically, only one of the two primary windings will be in use at any one time.

Figure 11:
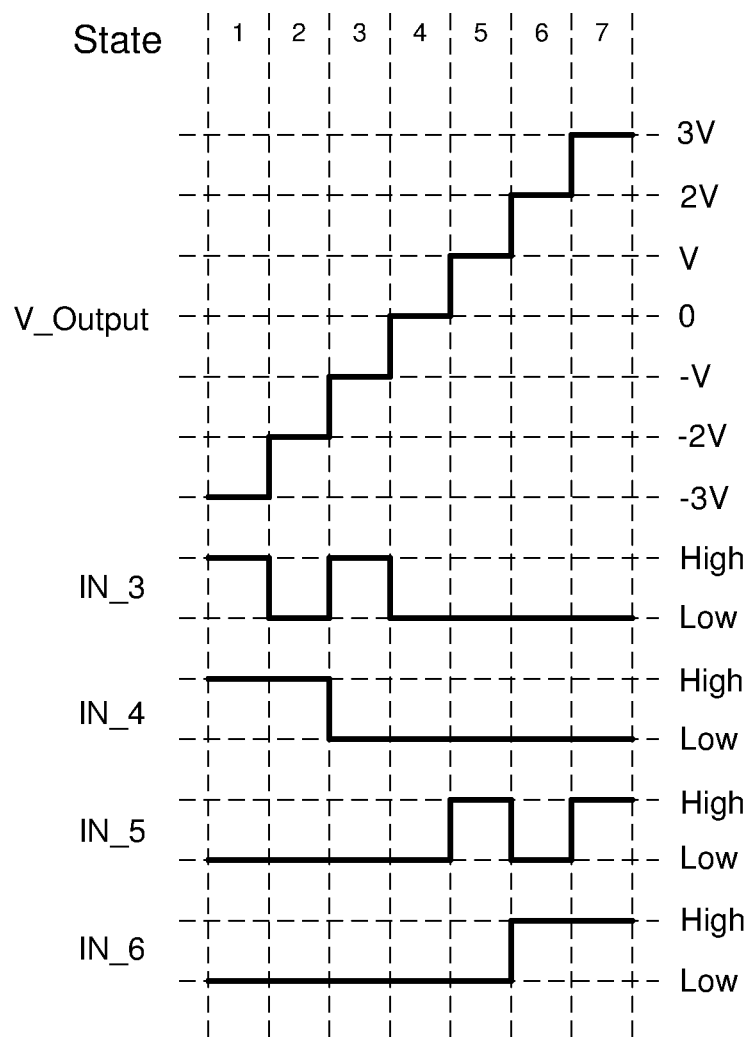
FIG. 11 is a graph showing how the voltage applied across the transformer in the amplifier circuit of FIG. 10 varies for different configurations of the switches in the amplifier circuit.

FIG. 11 shows how the output voltage V_Output that is applied across the primary windings 1003a, 1003b varies depending on the state of the switches in the two sub-circuits 1002a, 1002b. It will be appreciated that where V_Output is positive, this corresponds to a voltage being applied across the primary winding 1003a of the first sub-circuit 1002a and where V_Output is negative, this corresponds to a voltage being applied across the primary winding 1003b of the second sub-circuit 1002b. The amplifier circuit of FIG. 10 can output a total of 7 different voltages, ranging from −3V to +3V. The various switch configurations used to generate the potential differences across the primary transformer coil are summarised in the Table of FIG. 12.

Figure 13:
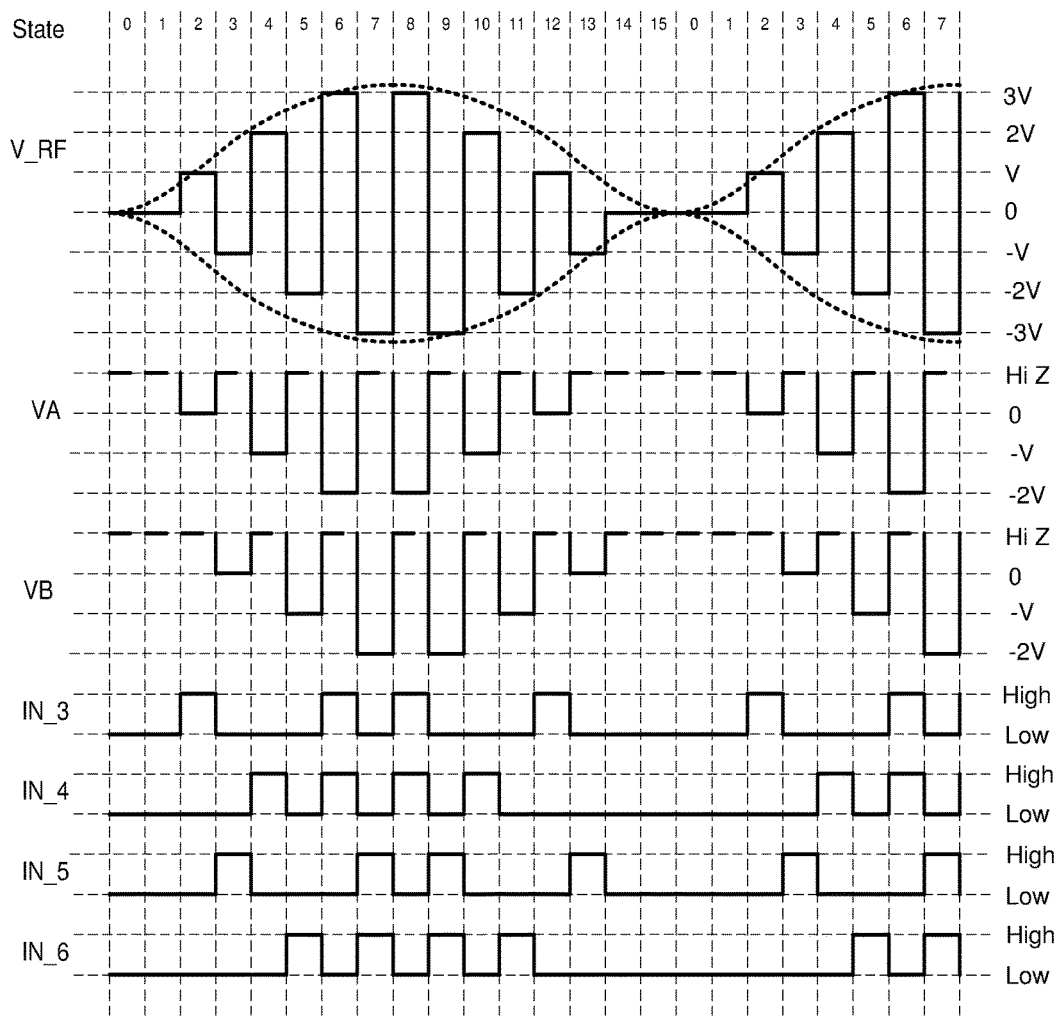
FIG. 13 is a graph showing how the change in voltage that is induced in the secondary transformer coil of FIG. 10 can be used to apply amplitude modulation to an input RF signal.

FIG. 13 shows an example of how the change in voltage that is induced in the secondary transformer coil of FIG. 10 can be used to apply amplitude modulation to an input RF signal. By varying the input signals IN_3, IN_4, IN_5, IN_6 to the respective sub-circuits, it is possible to cause a change in potential VA and VB, where VA is the potential at the upper terminal of the primary winding 1003a in the first sub-circuit 1002a and VB is the potential at the lower terminal of the primary winding 1003b in the second sub-circuit 1002b. In so doing, it is possible to change the voltage that is applied across the primary transformer windings 1003a, 1003b in each sub-circuit. As the voltage applied across the primary transformer windings changes, the voltage that is induced in the secondary transformer coil 1005 will also change, providing a time varying voltage signal V_RF that can be used to modulate the amplitude of the input RF signal.

It will be noted from the voltage signatures in FIG. 13 that the two sub-circuits 1002a, 1002b are operated alternately, such that at any one time, one of the two sub-circuits is inactive (in FIG. 13, this is represented by the label "Hi Z" meaning the sub-circuit in which the respective terminal VA, VB is located is at high impedance). When inactive, each one of the switches in the respective sub-circuit is turned off, such that the sub-circuit does not contribute to the voltage that is induced in the secondary transformer coil 1005.

As discussed previously, the geometry of the two sub-circuits means that the voltage applied across the primary transformer winding 1003a of the first sub-circuit 1002a is always opposite in direction from the voltage that is applied across the primary transformer winding 1003b of the second sub-circuit 1002b. The difference in direction between these voltages, coupled with the alternating operation of the two sub-circuits 1002a, 1002b, gives rise to negative and positive excursions in the time varying signal V_RF. The two sub-circuits may be switched at a particular frequency, such that the switch from a negative excursion to a positive excursion coincides with a pre-determined number of cycles in the RF wave. For example, the two sub-circuits may be switched at a frequency that matches the carrier frequency of the input RF signal.

Figure 14:
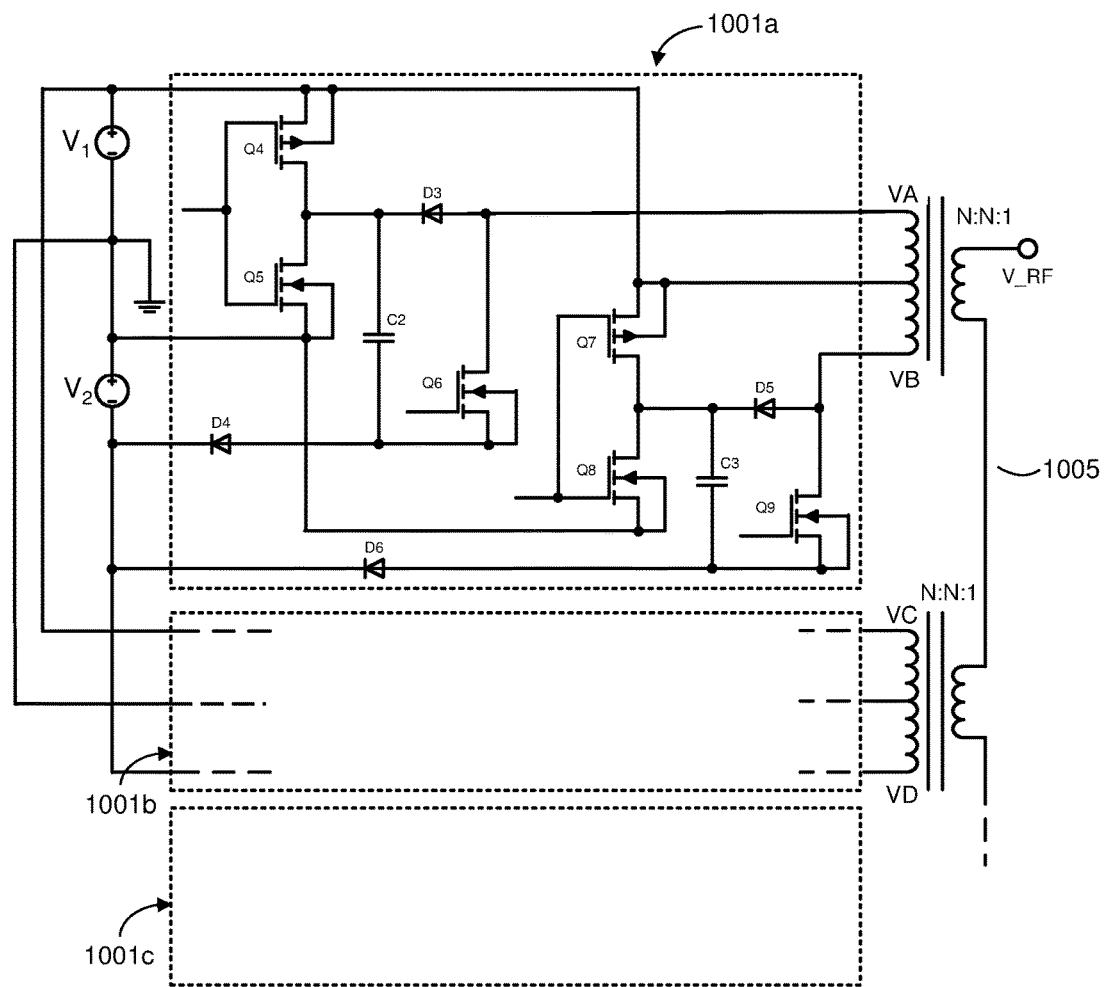
FIG. 14 shows how a plurality of amplifier circuits such as that shown in FIG. 10 may be arranged in a cascade in an amplifier according to the second embodiment.

FIG. 14 shows an example in which a plurality of amplifier circuits 1001a, 1001b, 1001c, such as the one shown in FIG. 10, are arranged in a cascade and used to generate a large number of different voltages for use in amplifying an input RF signal. (For clarity, only the second amplifier circuit 1001b is shown as being connected to the power sources $V_1$ and $V_2$ but it will be appreciated that the third amplifier circuit 1001c and any additional amplifier circuits can also be connected to the power sources $V_1$ and $V_2$ in a similar fashion). In the example shown in FIG. 14, each one of the amplifier circuits 1001a, 1001b, 1001c has the same arrangement of switches and diodes and charge storage device as in the amplifier circuit 1001 of FIG. 10. The amplifier circuits are each arranged in parallel with one another and are all powered by the same pair of power sources $V_1$ and $V_2$.

As before, the transformer coils arranged at the respective outputs of the amplifier circuits 1001a, 1001b, 1001c can each be used to induce a voltage in the same single secondary coil 1005. From this, it can be seen that the total induced voltage in the secondary transformer coil will vary depending on the rate of change of current magnitude passing through the respective coils in each amplifier circuit 1001a, 1001b, 1001c. The potential difference that is applied across the primary windings in each amplifier circuit and the rate at which that potential difference is caused to vary can be controlled independently for each circuit by operating the switches in the respective amplifier circuit. The total voltage induced in the secondary transformer coil 1005 determines the amplitude of the RF signal. Since each individual amplifier circuit 1001a, 1001b, 1001c, can output a total of 7 different voltages (−3V, −2V, −V, 0, +V, +2V and +3V), the total number of discrete voltages that can be induced in the secondary coil 1005 is increased compared to the example shown in FIG. 7, providing an overall higher dynamic range for amplifying the input RF signal.

Figure 15:
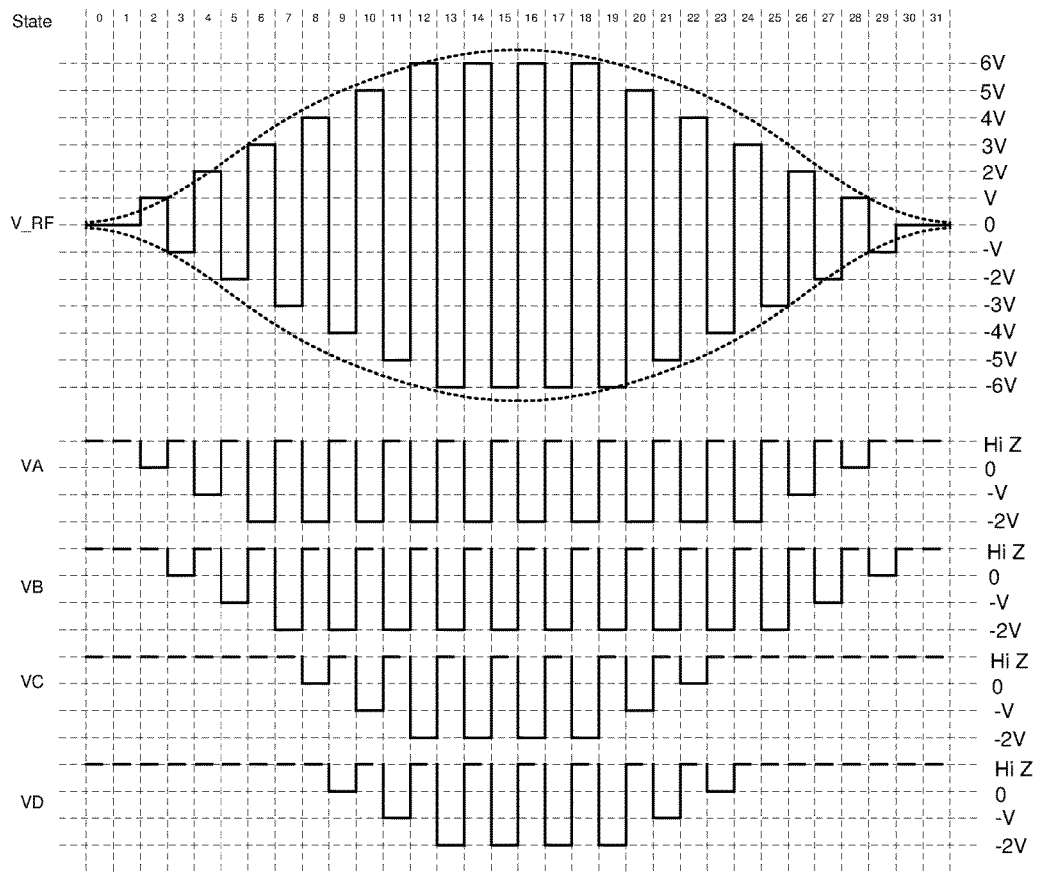
FIG. 15 is a graph showing how the voltage V_RF that is induced in the secondary transformer coil of FIG. 14 can be used to apply amplitude modulation to an input RF signal.

FIG. 15 shows an example of how the voltage V_RF that is induced in the secondary transformer coil of FIG. 14 can be used to apply amplitude modulation to an input RF signal (note that, for the purpose of explanation, it is assumed in FIG. 15 that the amplifier comprises the two uppermost amplifier circuits shown in FIG. 14). By varying the input signals to the four respective sub-circuits in the amplifier circuits 1001a and 1001b, it is possible to cause a change in potential at the terminals VA, VB, VC, VD, which will in turn change the voltage that is applied across the primary transformer windings in those four sub-circuits. As the voltage applied across each primary transformer changes, the voltage that is induced in the secondary transformer coil will also change, providing a time varying voltage signal V_RF that can be used to modulate the amplitude of the input RF signal.

As previously discussed in relation to FIG. 13, within each individual amplifier circuit, the two sub-circuits may be operated at different times from one another. For example, the sub-circuits may be operated alternately, such that at any one time, one of the two sub-circuits is inactive (in FIG. 15, this is represented by the label "Hi Z" meaning the sub-circuit in which the respective terminal VA, VB, VC, VD is located is at high impedance). When inactive, each one of the switches in the respective sub-circuit is turned off, such that the sub-circuit does not contribute to the voltage that is induced in the secondary transformer coil.

The total voltage that is induced in the second transformer coil will be proportional to the sum of the voltages applied across the respective primary transformers in each (active) sub-circuit. Typically, the amplifier will function by bringing into operation a single one of the amplifier circuits and then gradually bringing into operation further amplifier circuits as the required level of amplification increases. For example, referring to FIG. 15, it can be seen that for smaller values of V_RF, only the first amplifier circuit 1001a (comprising terminals VA and VB is engaged), whilst the second amplifier circuit 1001b that supplies terminals VC, VD is only brought into operation once the first amplifier circuit has reached its maximum output of +/− 3V. The outputs from the two amplifier circuits 1001a, 1001b are added to increase the instantaneous amplitude of the signal V_RF, so enabling amplitude modulation of the input RF signal. The total number of voltage levels available will be increased if additional amplifier circuits, including amplifier circuit 1001c, are added to the cascade in FIG. 14.

Figure 16:
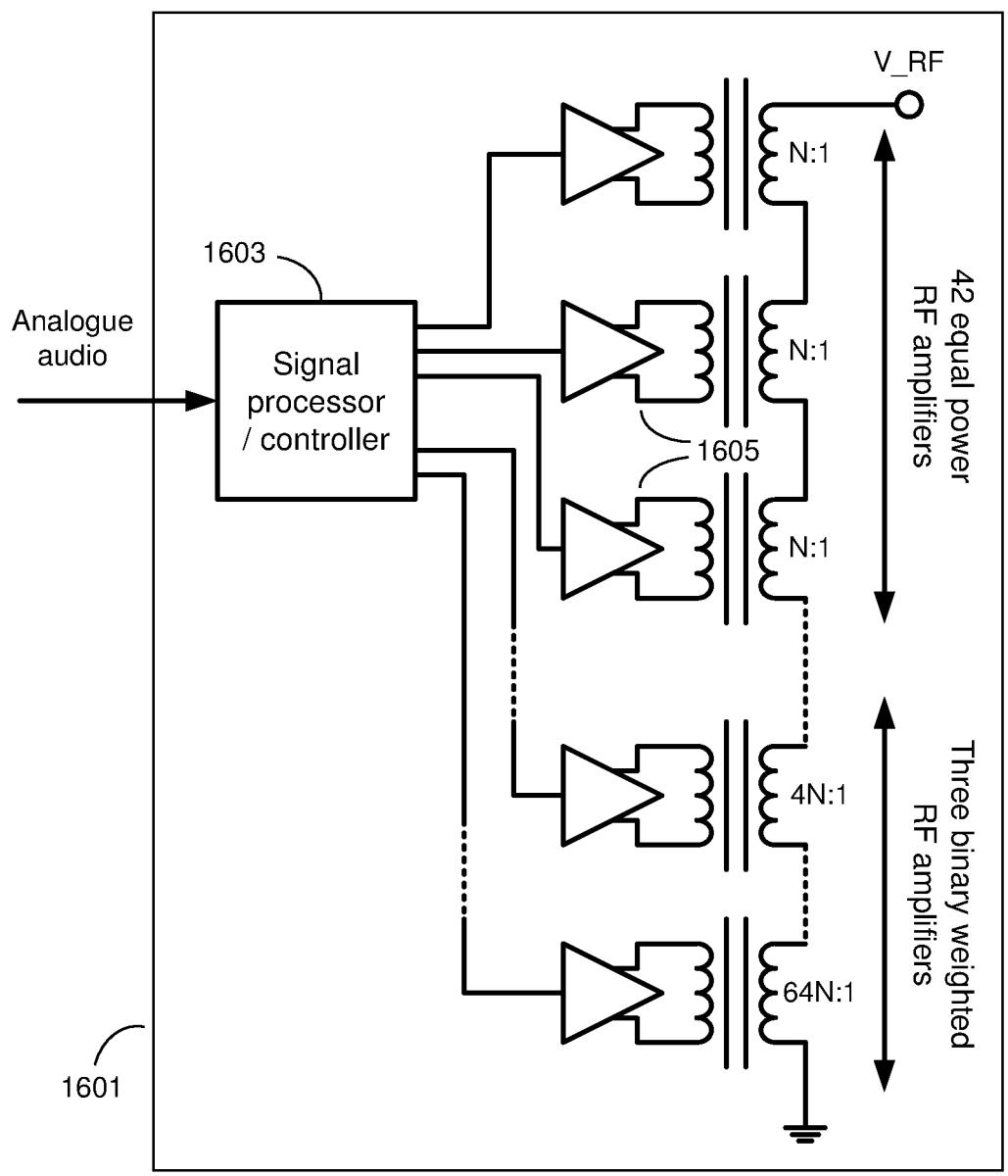
FIG. 16 shows an amplifier according to an embodiment.

FIG. 16 shows an example of an amplifier 1601 according to an embodiment. The amplifier includes an input for receiving an analogue audio signal that is to be amplified, a signal processor/controller 1603 that performs analogue to digital conversion of the analogue signal and which controls the inputs to a plurality of amplifier circuits 1605 that are used to amplify the digitised signal. In the present example, the amplifier circuits comprise a cascaded arrangement such as that shown in FIG. 7 or 14, with each amplifier circuit having a pair of sub-circuits that can provide positive or negative excursions when amplifying the input signal. It will be noted that, in comparison to the conventional arrangement of FIG. 1, in which the RF and digital control are presented to the H-bridge cells separately, in the embodiment of FIG. 16, the RF and digital control are generated and presented together to the different amplifier circuits.

Figure 17:
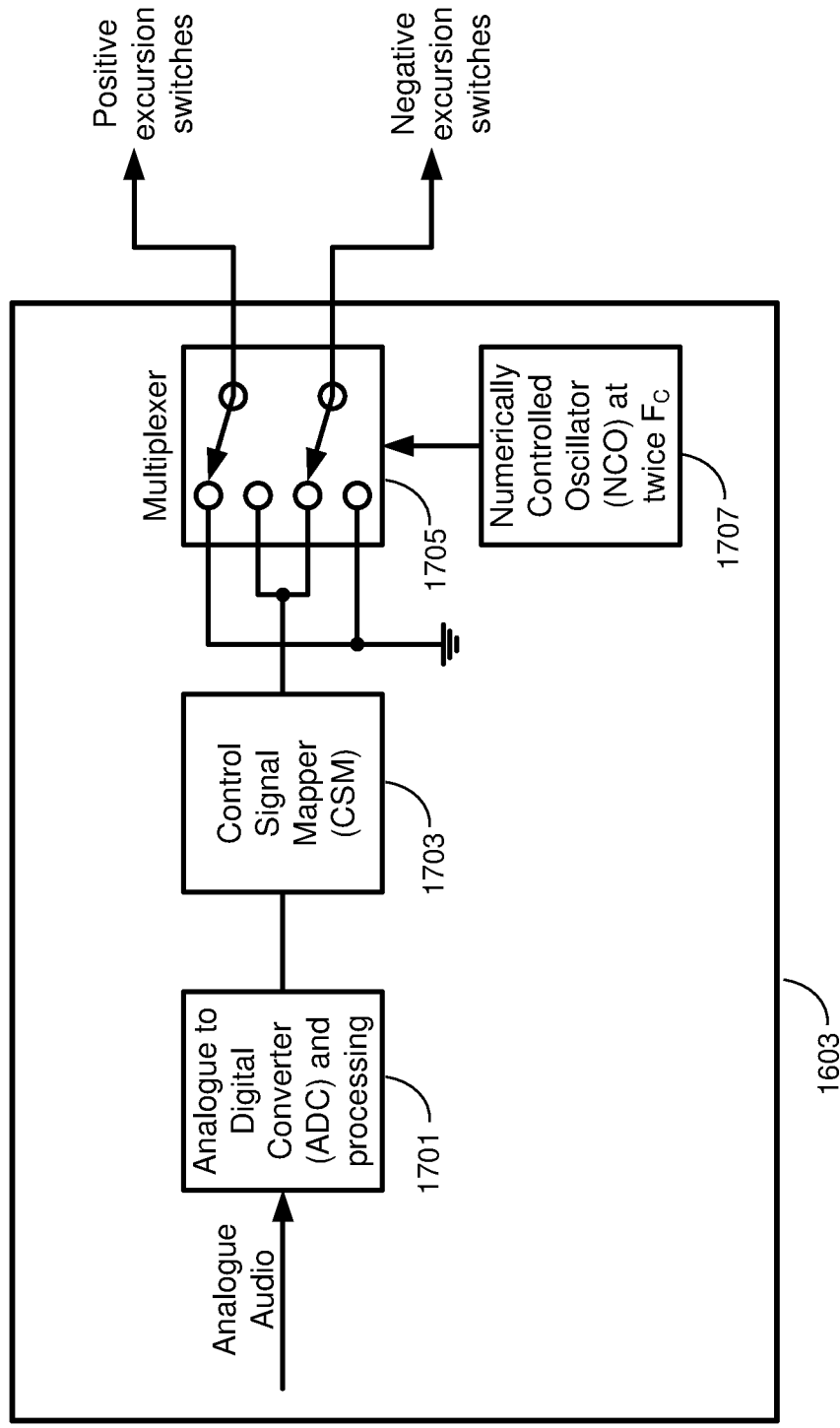
FIG. 17 shows components of the signal processor/controller of FIG. 16, according to an embodiment.

The components of the signal processor/controller 1603 are shown in more detail in FIG. 17. The input signal is sampled by the ADC 1701 (20 kS/s being a typical sampling rate) and applied to a control signal mapper (CSM) 1703 that derives appropriate control signals for driving the switches in each respective amplifier circuit. The control signals are multiplexed by a multiplexer 1705, which itself is triggered by a numerically controlled oscillator (NCO) 1707 at twice the carrier frequency. The multiplexer acts to alternately direct the output of the control signal mapper 1703 to the sub-circuits that are used to provide positive excursions when amplifying the input signal and the sub-circuits that are used to provide negative excursions when amplifying the input signal.

Figure 18:
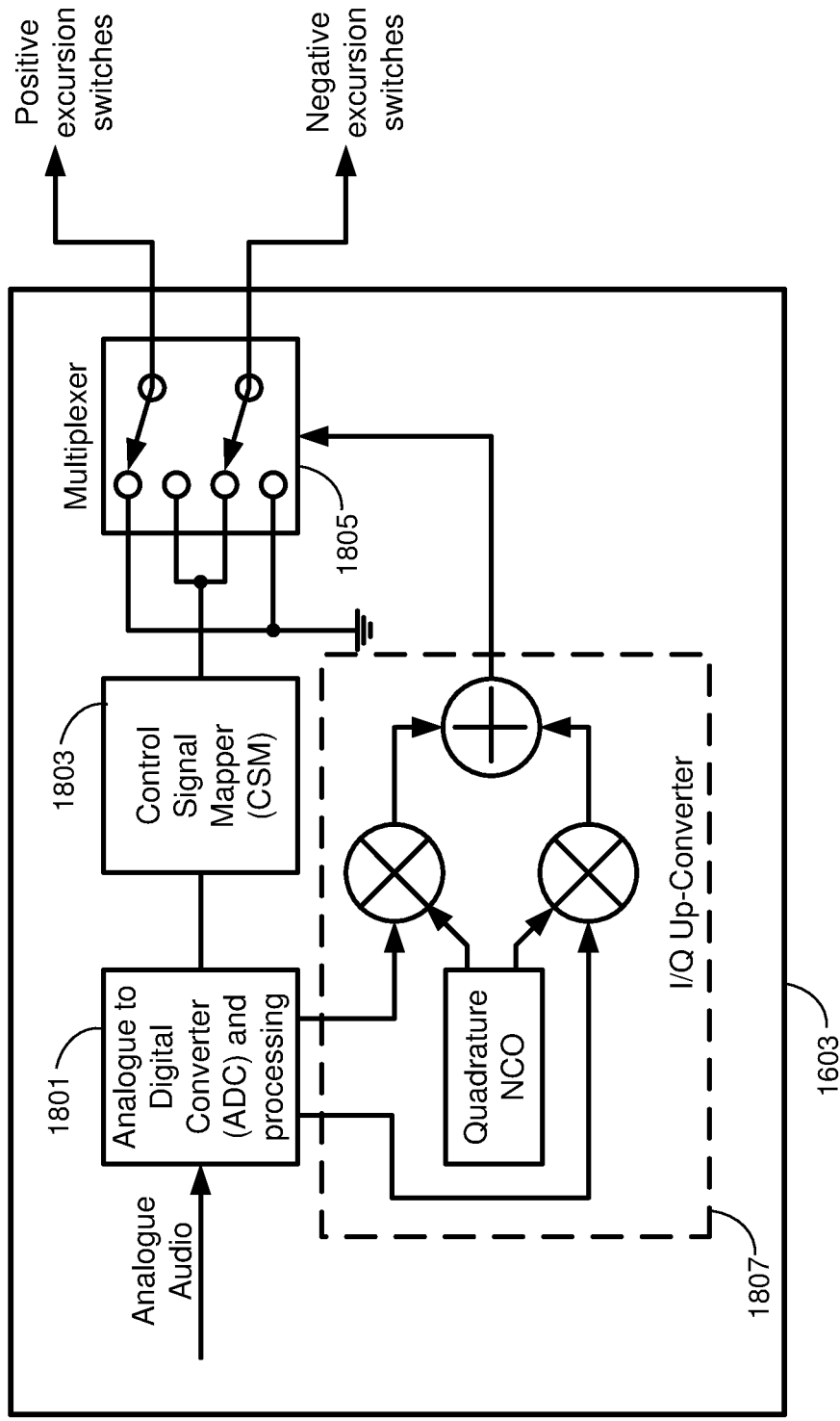
FIG. 18 shows components of the signal processor/controller of FIG. 16, according to another embodiment.

FIG. 18 shows components that may be used in the signal processor/controller 1603 of FIG. 16 in another embodiment that is suitable for Digital Radio Mondale. Here, the signal processor 1603 includes similar components to that shown in FIG. 17, but also includes an I/Q Up-Converter 1807 that can be used to encode phase information on the NCO output and to drive the input to the CSM appropriately.

Figure 19:
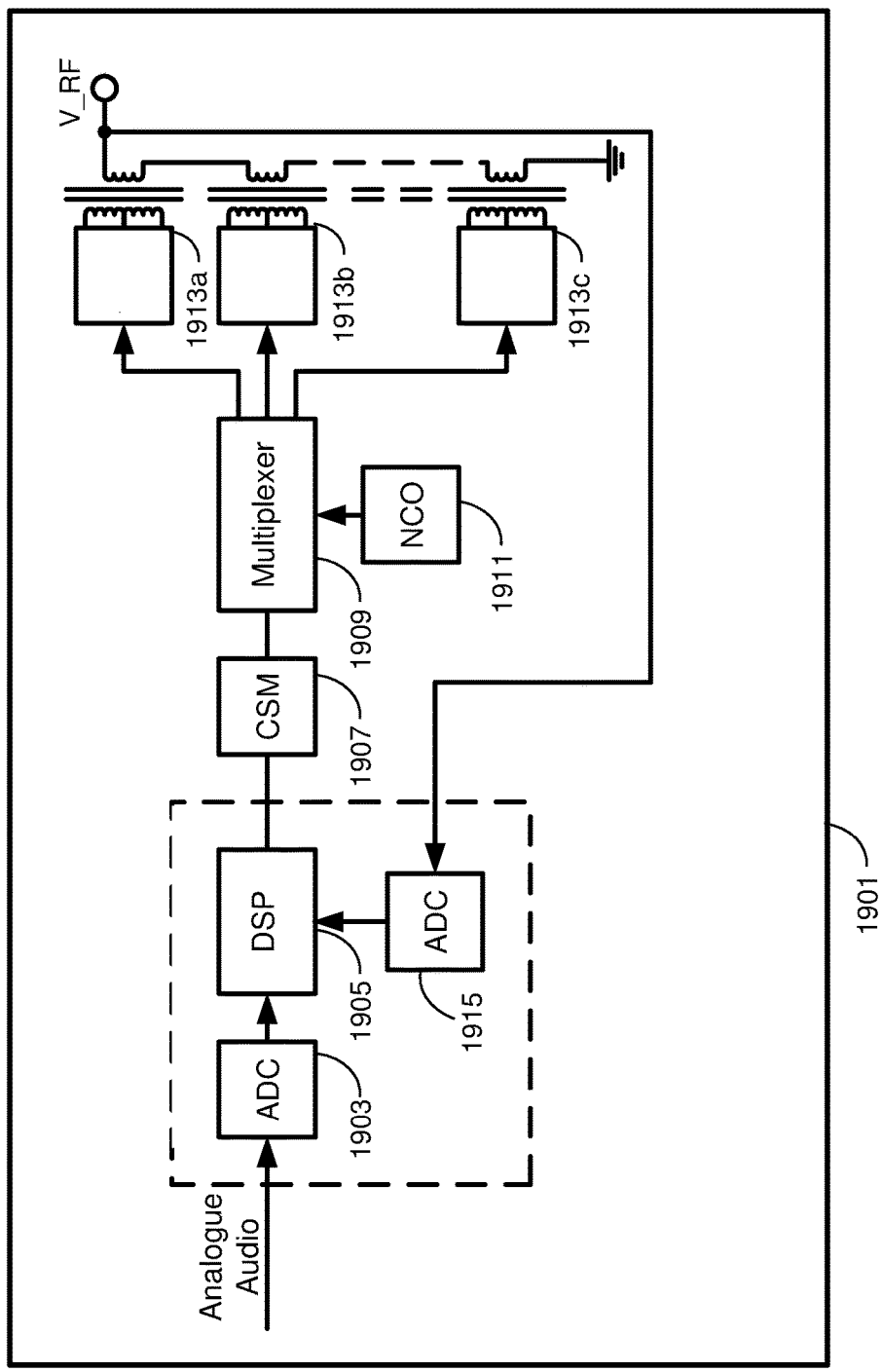
FIG. 19 shows an amplifier according to another embodiment.

FIG. 19 shows an amplifier 1901 according to another embodiment. The components of the amplifier are similar to those shown in FIG. 16 and include a first ADC 1903 for digitising an input analogue audio signal, a digital signal processor 1905, a control signal mapper (CSM) 1907, multiplexer 1909 and numerically controlled oscillator (NCO) 1911. Here, the plurality of amplifier circuits 1913*a*, 1913*b*, 1913*c* may take the form of the amplifier circuits shown in the cascade of FIG. 7 or 14, for example.

As before, the multiplexer 1909 is used to direct the output of the control signal mapper 1907 to the respective sub-circuits in each amplifier circuit. The amplifier of FIG. 19 makes use of negative feedback to moderate amplification of the input signal. Here, the output signal V_RF is sampled by a second ADC 1915 and fed back into the digital signal processor (DSP) 1905. The digital signal processor may in turn use this feedback to moderate the potential difference that is applied across the output of each amplifier circuit 1913*a*, 1913*b*, 1913*c*.

By replacing the H-bridge cells of conventional amplifiers with a plurality of amplifier circuits such as those described in embodiments herein, it is possible to construct an amplifier that has a comparable dynamic range, whilst reducing the number of circuits by almost two thirds, to of the order 45. Reducing the number of transformers can in turn help to reduce weight, size and manufacturing cost. The number of switching transistors may also be reduced. More accurate control can be achieved by use of the digital control systems described in relation to FIGS. 16 to 19.

While certain embodiments have been described, these embodiments have been presented by way of example only, and are not intended to limit the scope of the invention. Indeed, the novel methods, devices and systems described herein may be embodied in a variety of forms; furthermore, various omissions, substitutions and changes in the form of the methods and systems described herein may be made without departing from the spirit of the invention. For example, whilst in the above described embodiments, the multiple amplifier circuits are cascaded using multiple transformers connected in series, this is not essential and it is possible that the output from the plurality of amplifier circuits may be summed using a multi-tap transformer.

The accompanying claims and their equivalents are intended to cover such forms or modifications as would fall within the scope and spirit of the inventions.

The invention claimed is:

1. An amplifier for modulating the amplitude of an RF signal, the amplifier comprising:
   a plurality of amplifier circuits, each circuit being connected to a first power source, each circuit having a charge storage device and an output across which a potential difference supplied by the first power source can be applied;
   a switching arrangement for switching connections between the first power source, the charge storage device and the output in each amplifier circuit, wherein each circuit has a first switched configuration in which the charge storage device is charged by the first power source and a second switched configuration in which the charge storage device, once charged, will apply an additional potential difference across the output;
   the amplifier being configured to vary the amplitude of the RF signal in proportion to the sum of the potential differences applied across the output in each amplifier circuit.

2. An amplifier according to claim 1, wherein when a respective amplifier circuit is in the first switched configuration, the first power source is arranged to apply a potential difference across the output of that amplifier circuit, in addition to charging the charge storage device.

3. An amplifier according to claim 2, wherein when a respective amplifier circuit is in the second switched configuration, the first power source is arranged to apply a potential difference across the output of that amplifier circuit.

4. An amplifier according to claim 1, wherein each circuit is connected to a second power source and the switching arrangement is arranged to switch connections between the second power source, the charge storage device and the output in each amplifier circuit,
   wherein when a respective amplifier circuit is in the first switched configuration, the charge storage device in that amplifier circuit is charged by both the first power source and the second power source.

5. An amplifier according to claim 3, wherein when a respective amplifier circuit is in the first switched configuration, both the first power source and second power source are arranged to apply a potential difference across the output of that amplifier circuit, in addition to charging the charge storage device.

6. An amplifier according to claim 3, wherein when a respective amplifier circuit is in the second switched configuration, the first power source is arranged to apply a potential difference across the output of that amplifier circuit and the second power source is excluded from applying a potential difference across the output of that amplifier circuit.

7. An amplifier according to claim 1, wherein each amplifier circuit has a primary transformer winding connected across its respective output, the primary transformer windings being arranged to induce a voltage in a secondary transformer winding,
   wherein the voltage induced in the secondary transformer winding is used to determine the amplitude of the RF signal.

8. An amplifier according to claim 1, wherein each amplifier circuit comprises a first sub-circuit and a second sub-circuit, the charge storage device and the output being comprised within the first sub-circuit and the second sub-circuit comprising a second charge storage unit and a second output across which a potential difference supplied by the first power source can be applied;
   wherein the switching arrangement is configured to switch connections between the first power source, the charge storage device and the output in the first sub-circuit and to switch connections between the first power source, the second charge storage device and the second output in the second sub-circuit, wherein each sub-circuit has a first switched configuration in which its charge storage device is charged by the first power source and a second switched configuration in which its charge storage device, once charged, will apply an additional potential difference across the output of the sub-circuit; and the amplifier being configured to vary the amplitude of the RF signal in proportion to the sum of the potential differences applied across each one of the outputs in the sub-circuits.

9. An amplifier according to claim 8, wherein when a respective sub-circuit is in the first switched configuration, the first power source is arranged to apply a potential difference across the output of that sub-circuit, in addition to charging the charge storage device in that sub-circuit.

10. An amplifier according to claim 9, wherein when a respective sub-circuit is in the second switched configuration, the first power source is arranged to apply a potential difference across the output of that sub-circuit.

11. An amplifier according to claim 9, wherein each sub-circuit is connected to a second power source and the switching arrangement is arranged to switch connections between the second power source, the charge storage device and the output in each sub-circuit, wherein when a respective sub-circuit is in the first switched configuration, the charge storage device in that sub-circuit is charged by both the first power source and the second power source.

12. An amplifier according to claim 11, wherein when a respective sub-circuit is in the first switched configuration, both the first power source and second power source are arranged to apply a potential difference across the output of that sub-circuit, in addition to charging the charge storage device in that sub-circuit.

13. An amplifier according to claim 11, wherein when a respective sub-circuit is in the second switched configuration, the first power source is arranged to apply a potential difference across the output of that sub-circuit and the second power source is excluded from applying a potential difference across the output of that sub-circuit.

14. An amplifier according to claim 9, wherein within each amplifier circuit, the first and second sub-circuits are arranged such that when the first sub-circuit is in its first and second switched configurations, the potential difference that is applied across the output of the first sub-circuit is in the opposite direction from the potential difference that is applied across the second sub-circuit when the second sub-circuit is in its first and second switched configurations.

15. An amplifier according to claim 14, wherein for each amplifier circuit, the switching arrangement is configured to alternate activation of the first and second sub-circuits, such that when a potential difference is applied across the output of one of the two sub-circuits, no potential difference is applied across the output of the other of the two sub-circuits.

16. An amplifier according to claim 15, wherein the amplifier is configured to activate the first sub-circuits in unison and to activate the second sub-circuits in unison, wherein when the first sub-circuits are activated, each one of the first sub-circuits contributes to increasing the positive amplitude of the RF signal and when the second sub-circuits are activated, each one of the second sub-circuits contributes to increasing the negative amplitude of the RF signal.

17. An amplifier according to claim 16, wherein the amplifier is configured to alternate activation of the first and second sub-circuits at a frequency that is twice that of the carrier frequency of the RF signal.

18. An amplifier according to claim 8, wherein each sub-circuit has a primary transformer winding connected across its respective output, the primary transformer windings being arranged to induce a voltage in a secondary transformer winding, wherein the voltage induced in the secondary transformer winding is used to determine the amplitude of the RF signal.

19. An amplifier according to claim 18, wherein in each amplifier circuit, the coils that are connected across the output of the first and second sub-circuits share a common node with one another.

20. An amplifier according to claim 8, comprising an I/Q Up-Converter, wherein the Up-Converter is configured to encode phase information on the RF signal by driving the switching arrangement to activate the first and second sub-circuits at pre-determined intervals.

21. An amplifier according to claim 1, comprising a detector for monitoring the amplified signal and for providing associated feedback to the amplifier, such that the amplifier is able to modulate the amplitude of the RF signal.

22. An amplifier according to claim 1, comprising an analogue to digital converter for converting an input analogue RF signal to a digital signal before varying the amplitude of the digitised signal.

23. A transmitter comprising an amplifier according to claim 1 and an antenna for broadcasting the amplified signal.

* * * * *